United States Patent
Sato et al.

(10) Patent No.: US 7,107,504 B2
(45) Date of Patent: Sep. 12, 2006

(54) TEST APPARATUS FOR SEMICONDUCTOR DEVICE

(75) Inventors: Masahiro Sato, Kawasaki (JP); Junji Akaza, Kawasaki (JP); Nobumi Kodama, Kawasaki (JP); Hirohisa Mizuno, Kawasaki (JP); Takashi Imura, Kawasaki (JP); Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 427 days.

(21) Appl. No.: 10/073,129

(22) Filed: Feb. 13, 2002

(65) Prior Publication Data

US 2003/0002365 A1    Jan. 2, 2003

(30) Foreign Application Priority Data

Jun. 29, 2001   (JP) ............................. 2001-199188

(51) Int. Cl.
   *G01R 31/28* (2006.01)
   *G11C 29/00* (2006.01)
(52) U.S. Cl. .................................. 714/733; 714/718
(58) Field of Classification Search .............. 714/25, 714/30, 42, 702, 724–740, 718, 720; 365/201, 365/63, 51; 324/765, 719, 755; 702/120
   See application file for complete search history.

(56) References Cited

U.S. PATENT DOCUMENTS

| 5,600,257 | A | * | 2/1997 | Leas et al. ................ 324/754 |
| 6,097,206 | A | * | 8/2000 | Takano ..................... 324/765 |
| 6,219,289 | B1 | * | 4/2001 | Satoh et al. ................ 365/201 |
| 6,489,791 | B1 | * | 12/2002 | Tsujii ...................... 324/755 |
| 6,587,979 | B1 | * | 7/2003 | Kraus et al. ................ 714/720 |

FOREIGN PATENT DOCUMENTS

| JP | 9-49864 | 2/1997 |
| JP | 10-510682 | 10/1998 |
| JP | 2000-100880 | 4/2000 |
| WO | WO 97/06444 | 2/1997 |

* cited by examiner

*Primary Examiner*—Guy Lamarre
*Assistant Examiner*—John J. Tabone, Jr.
(74) *Attorney, Agent, or Firm*—Arent Fox PLLC (57) ABSTRACT

A test apparatus for a semiconductor device, which improves the reliability of an operational test on target devices on a wafer using BOST (Built Out Self Test) and BIST (Built In Self Test). The test apparatus includes an external test unit, the BIST circuit formed in the semiconductor device, and BOST device which is coupled between the external test unit and the semiconductor device. Pattern data for a pattern dependency test is stored in the BIST circuit and pattern data for a timing dependency test is stored in the BOST device.

9 Claims, 12 Drawing Sheets

TEST APPARATUS FOR SEMICONDUCTOR DEVICE

BACKGROUND OF THE INVENTION

The present invention relates to a test apparatus for a semiconductor device, and, more particularly, to a test apparatus equipped with a test circuit connected between a semiconductor device and an external test unit.

In case where a test for circuit functions or electric characteristics or the like is performed on a plurality of chips of semiconductor memory devices on a wafer, conventionally, a probe is made to contact a pad of each chip and is connected to a test apparatus via a connection cable. The test apparatus provides a predetermined test program to each chip and conducts individual function tests in accordance with the test program.

The probe test suffers a poor precision of signal waveforms to be supplied to the test apparatus and cannot sufficiently secure the reliability in an operational test on a semiconductor memory device which operates at a high speed.

As the operational speeds and the capacities of recent semiconductor memory devices are increased, there arises a problem such that the performance of an external test unit cannot follow up the characteristics of the semiconductor memory devices.

To supplement the performance of the external test unit, therefore, a test chip called Built Out Self Test (BOST) or a test circuit which is called Built In Self Test (BIST) and preformed in each chip is intervened between a wafer and the external test unit.

Japanese Laid-Open Patent Publication No. 2000-100880 or Japanese Laid-Open Patent Publication No. 9-49864 discloses a test apparatus which has a BOST or BIST provided between an external test unit and a circuit to be measured and performs an operational test.

However, all tests, such as a timing dependency test and a pattern dependency test, cannot be controlled by the BOST or BIST. In other words, there are test items that can be executed only in a low-speed operational test which is conducted by an external test unit. This makes it difficult to speed up an operational test on target devices on a wafer.

SUMMARY OF THE INVENTION

Accordingly, it is an object of the present invention to provide a test apparatus for a semiconductor device, which improves the reliability of an operational test on target devices on a wafer using BOST and BIST.

In one aspect of the present invention, a test apparatus for testing a semiconductor device is provided. The test apparatus includes an external test unit, a test circuit formed in the semiconductor device, and a test device which is coupled between the external test unit and the semiconductor device. Pattern data for a pattern dependency test is stored in the test circuit and pattern data for a timing dependency test is stored in the test device.

In another aspect of the present invention, a semiconductor device is provided. The semiconductor device includes a BIST circuit in which plural pieces of test pattern data for performing a pattern dependency test are stored.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 1:
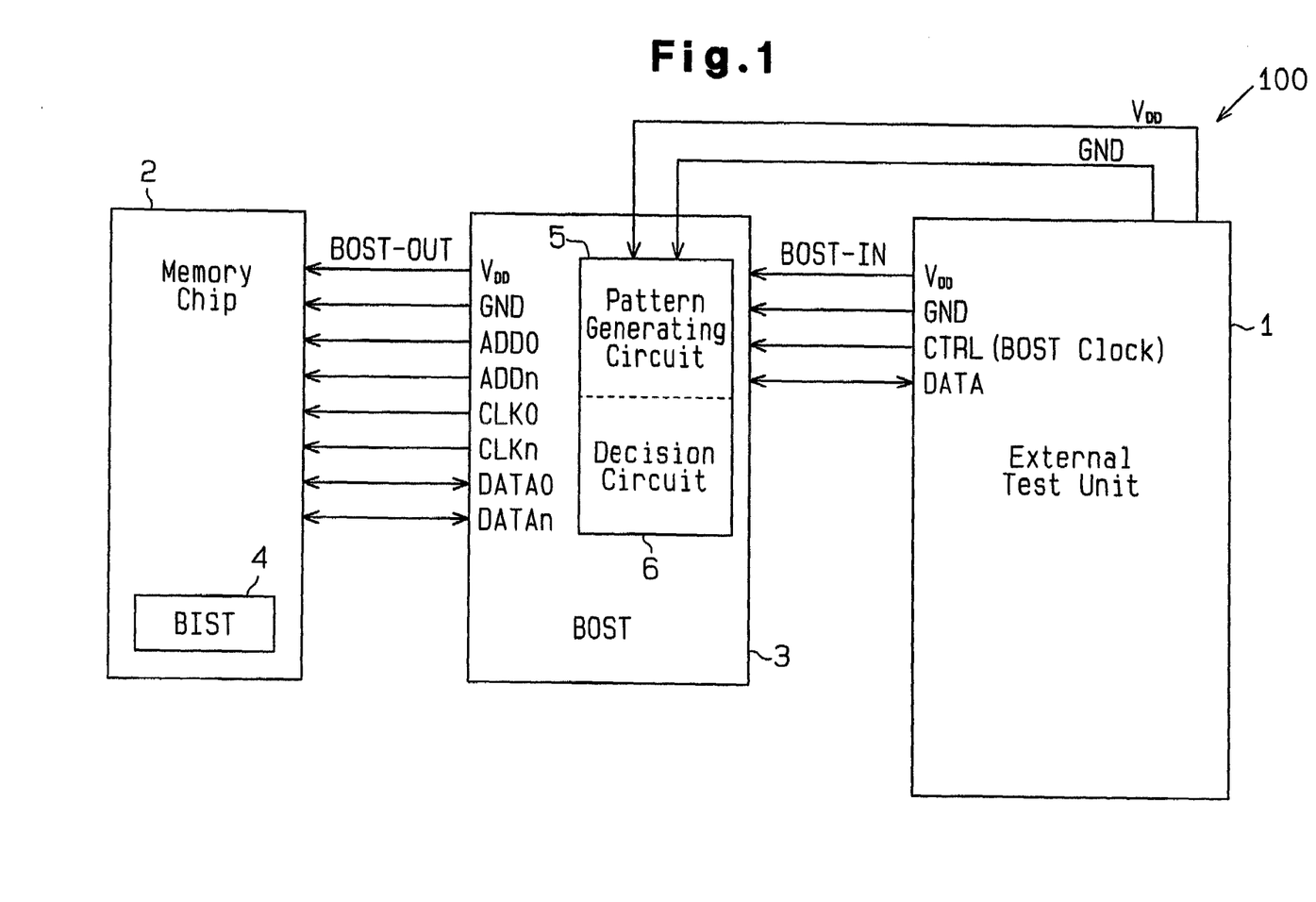
FIG. 1 is a schematic block diagram of a test apparatus according to one embodiment of the present invention.

FIG. 1 is a schematic block diagram of a test apparatus 100 according to one embodiment of the present invention. The test apparatus 100 includes an external test unit 1, a BOST device (hereinafter called "BOST") 3 and a BIST circuit (hereinafter called "BIST") 4. The BOST 3 is connected between a memory chip 2 or a to-be-tested chip on a wafer and the external test unit 1. The BOST 3 is a semiconductor chip for a test.

The BIST 4 is a test circuit formed in the memory chip 2. Stored in the BIST 4 are test patterns, such as march, refresh, disturb and long cycle, for a pattern dependency test.

The BOST 3 receives BOST-IN signals including supply voltages $V_{DD}$ and GND from the external test unit 1. The BOST 3 includes a pattern generating circuit 5 and a decision circuit 6.

The BOST 3 supplies the BIST 4 in the memory chip 2 with BOST-OUT signals including the supply voltages $V_{DD}$ and GND. The BOST-OUT signals are test mode signals for activating the BIST 4. The BIST 4 performs a pattern dependency test using prestored test patterns in accordance with the BOST-OUT signals and generates signals indicating test results.

The BIST 4 supplies the BOST 3 with signals DATA0 to DATAn indicating test results. The decision circuit 6 of the BOST 3 determines whether the test results are correct according to the signals DATA0 to DATAn and supplies the external test unit 1 with signals indicating test results.

Figure 2:
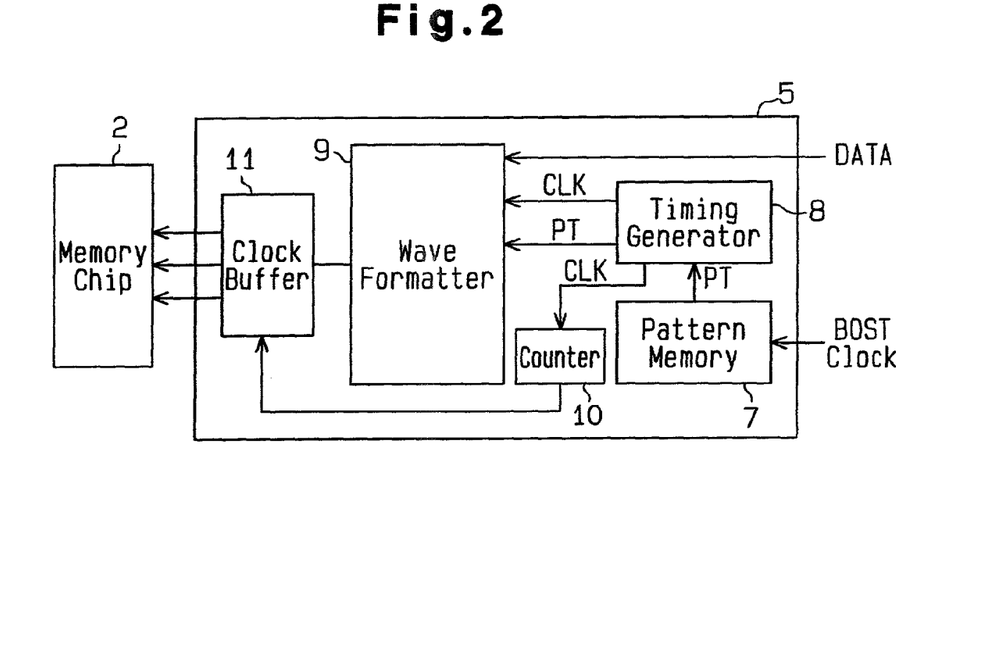
FIG. 2 is a schematic block diagram of a pattern generating circuit of the test apparatus of FIG. 1.

The pattern generating circuit 5 will now be described referring to FIG. 2. The pattern generating circuit 5 includes a pattern memory 7, a timing generator 8, a wave formatter 9, a counter 10 and a clock buffer 11. The pattern memory 7 is supplied with a BOST clock signal or a control signal from the external test unit 1. The pattern memory 7 supplies the timing generator 8 with prestored test pattern data PT for pattern data for a timing dependency test in accordance with the BOST clock signal. The test pattern data PT includes front pattern data.

The timing generator 8 generates a reference clock signal CLK and supplies the reference clock signal CLK to the wave formatter 9 and the counter 10. The timing generator 8 also provides the test pattern data PT to the wave formatter 9.

The wave formatter 9 receives an expected-value control signal or a signal DATA from the external test unit 1 and selects either front pattern data or back pattern data and supplies the selected pattern data to the clock buffer 11. When the front pattern data is selected, the wave formatter 9 supplies the front pattern data directly to the clock buffer 11. When the back pattern data is selected, the wave formatter 9 inverts the front pattern data to generate the back pattern data.

The counter 10 counts the pulses of the reference clock signal CLK and provides a count-up signal to the clock buffer 11 when the count value reaches a predetermined pulse number.

The clock buffer 11 receives test pattern data from the wave formatter 9 and supplies that test pattern data to the memory chip 2 every time it receives the count-up signal.

The memory chip 2 performs a timing dependency test based on the test pattern data supplied from the clock buffer 11 and the BOST-OUT signals supplied from the BOST 3.

The decision circuit 6 will now be explained with reference to FIG. 3. The decision circuit 6 includes a driver 12, a comparator 13, a P/F decision circuit 14 and a result holding RAM 15. The driver 12 receives test pattern data PT, generated by the pattern generating circuit 5, as write data WD and supplies the write data WD to the memory chip 2. The test pattern data PT is a write data pattern to be written in the memory chip 2.

After an operation of writing data in the memory chip 2 is finished, the written data is sequentially read from the memory chip 2. The comparator 13 receives the write data WD and compares the write data WD with read data RD. The comparator 13 generates a comparison signal of "0" when the write data WD matches with the read data RD and generates a comparison signal of "1" when there is no match.

The P/F decision circuit 14 receives the comparison signal from the comparator 13 and the expected-value control signal DATA from the pattern generating circuit 5. When the comparison signal is "0", the P/F decision circuit 14 supplies the result holding RAM 15 with a decision signal having the same value (e.g., 0) as the value of the expected-value control signal DATA. When the comparison signal is "1", the P/F decision circuit 14 supplies the result holding RAM 15 with a decision signal having a value (e.g., 1) opposite to the value of the expected-value control signal DATA.

The result holding RAM 15 stores the decision signal supplied from the P/F decision circuit 14. When the pattern generating circuit 5 provides an output command signal OCM to the result holding RAM 15 after an operation of reading data from the memory chip 2 is finished, the result holding RAM 15 supplies the stored decision signal to the external test unit 1.

When receiving the decision signal having the same value as the value of the expected-value control signal DATA from the P/F decision circuit 14 after the read operation is completed, the external test unit 1 decides that the memory chip 2 is normal. When receiving the decision signal whose value is opposite to the value of the expected-value control signal DATA from the P/F decision circuit 14, the external test unit 1 decides that the memory chip 2 is defective.

Figure 4:
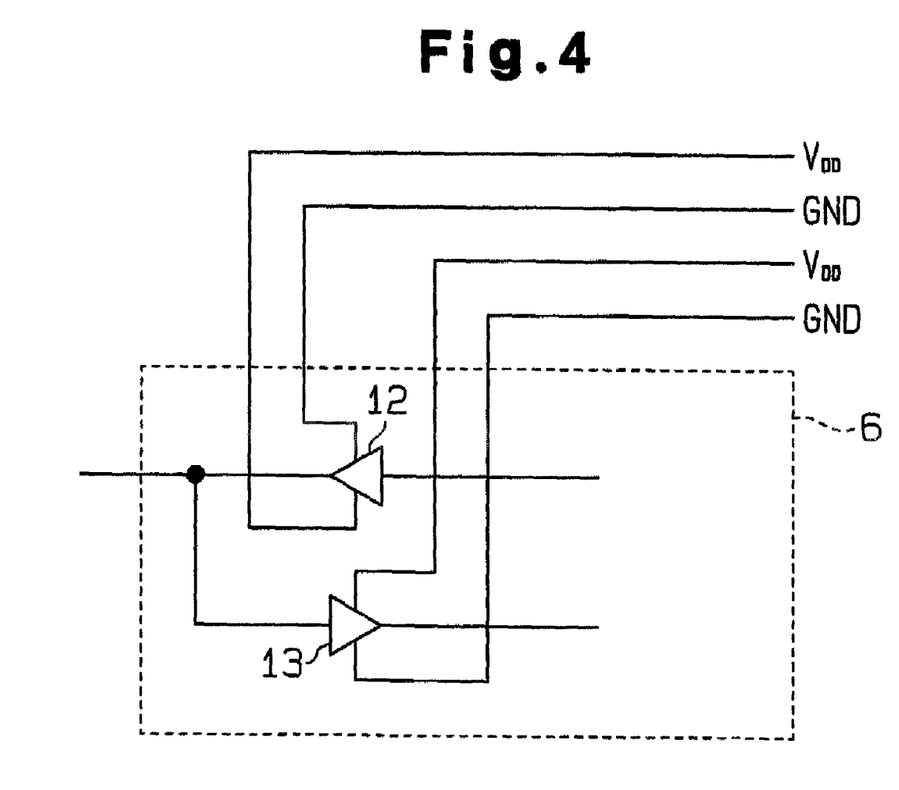
FIG. 4 is a schematic circuit diagram showing an input/output circuit of the decision circuit of FIG. 3.

As shown in FIG. 1, a supply voltage $V_{DD}$ and a ground potential GND are supplied as input/output determining supply voltages to the decision circuit 6 from the external test unit 1. Specifically, the supply voltage $V_{DD}$ and the ground potential GND are supplied to the driver 12 and the comparator 13 of the decision circuit 6, as shown in FIG. 4. The driver 12 receives the test pattern data PT and supplies the memory chip 2 with a write data signal having a maximum amplitude set by the potential difference between the supply voltage $V_{DD}$ and the ground potential GND.

The comparator 13 generates a predetermined decision level based on the supply voltage $V_{DD}$ and the ground potential GND and generates a binary comparison signal of "1" or "0" by comparing the read data from the memory chip 2 with the predetermined decision level. The output level of the driver 12 and the decision level of the comparator 13 can be adjusted arbitrarily by changing the voltage levels of the supply voltage $V_{DD}$ and the ground potential GND.

Figure 5:
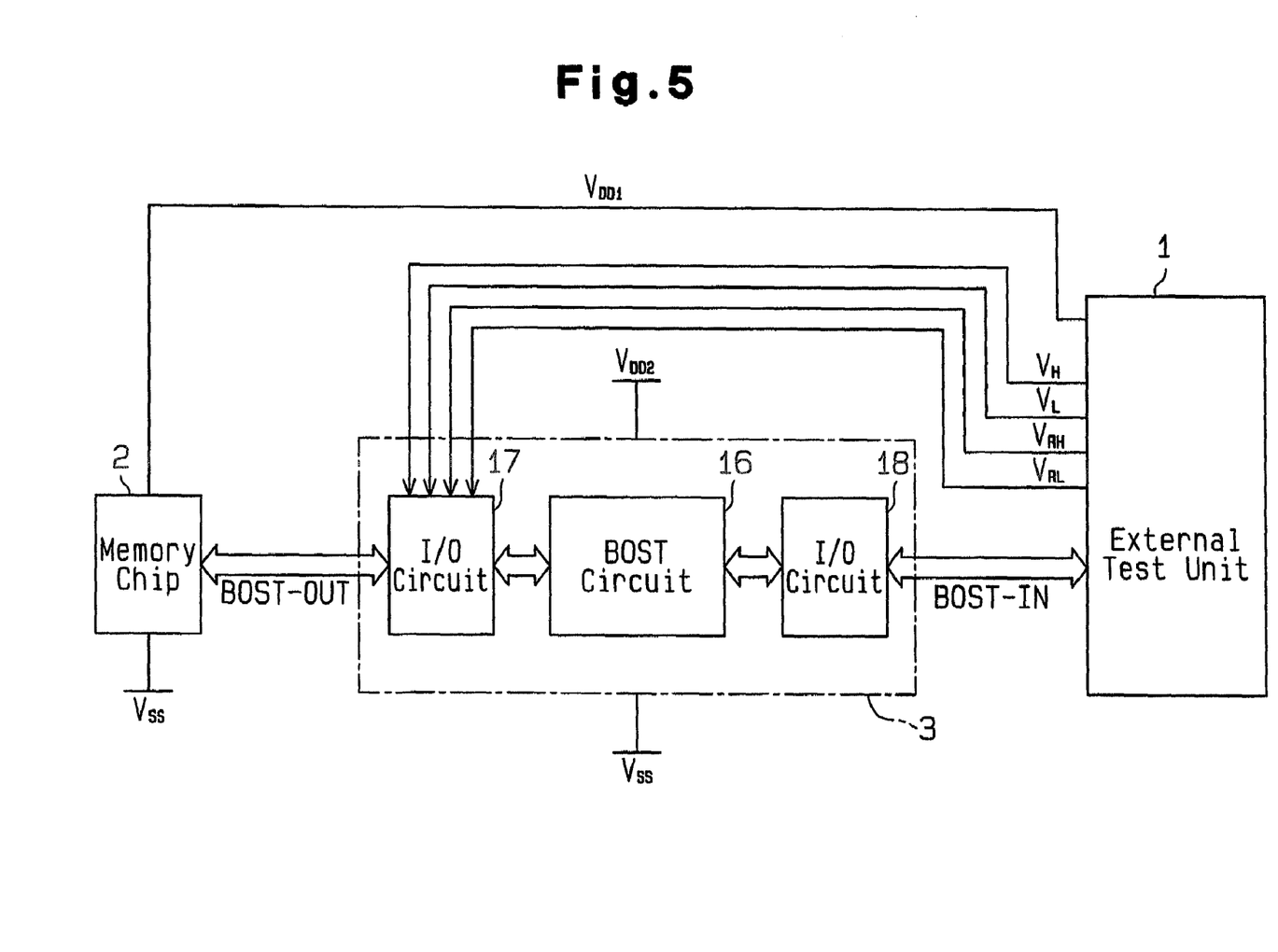
FIG. 5 is a schematic block diagram of a BOST of the test apparatus of FIG. 1.

As shown in FIG. 5, different supply voltages are supplied to the BOST 3 and the memory chip 2. In case of conducting an operational test on the memory chip 2, a supply voltage which is out the operation-guaranteeing range may be supplied in order to guarantee the supply voltage margin. Because the BOST 3 includes a circuit which needs to be operated with a high precision, such as a circuit for a timing test, a constant supply voltage of, for example, 3.3 V should be supplied to the BOST 3.

For example, the voltage of a voltage supply $V_{DD1}$ is supplied to the memory chip 2 from the external test unit 1 and the voltage of a voltage supply $V_{DD2}$ different from the voltage supply $V_{DD1}$ is supplied to the BOST 3.

The BOST 3 includes a BOST circuit 16, a memory-chip I/O circuit 17 connected between the BOST circuit 16 and the memory chip 2, and a test-apparatus I/O circuit 18 connected between the BOST circuit 16 and the external test unit 1.

The memory chip 2 is supplied with the voltage of the high-potential voltage supply $V_{DD1}$ of 3.9 V from the external test unit 1 and the BOST 3 is supplied with the voltage of the high-potential voltage supply $V_{DD2}$ of 3.3 V from the external test unit 1. The voltage of a low-potential voltage supply $V_{SS}$ is supplied to both the memory chip 2 and the BOST 3.

The input/output of signals between the BOST circuit 16 and the memory chip 2 is carried out via the memory-chip I/O circuit 17. The input/output of signals between the BOST circuit 16 and the external test unit 1 is carried out via the test-apparatus I/O circuit 18.

Output-level generation voltages $V_H$ and $V_L$ and input-level determining reference voltages $V_{RH}$ and $V_{RL}$ are supplied to the memory-chip I/O circuit 17.

The memory-chip I/O circuit 17 will now be discussed with reference to FIG. 6. The memory-chip I/O circuit 17 includes I/O buffers 19 which are equal in quantity to the input/output terminals of the BOST 3.

Each I/O buffer 19 includes a driver 20, comparators 21a and 21b and a buffer circuit 22. The output-level generation voltages $V_H$ and $V_L$ are supplied to the driver 20. Based on an input signal IN from the BOST circuit 16, the driver 20 supplies the memory chip 2 with an output signal OUT having a maximum amplitude set by the potential difference between the output-level generation voltages $V_H$ and $V_L$.

The input-level reference voltage $V_{RH}$ is provided to the comparator 21a. When the voltage of the signal supplied from the memory chip 2 is higher than the reference voltage $V_{RH}$, the comparator 21a supplies an output signal having an H (high) level to the buffer circuit 22.

The input-level reference voltage $V_{RL}$ is provided to the comparator 21b. When the voltage of the signal supplied from the memory chip 2 is lower than the reference voltage $V_{RL}$, the comparator 21b supplies an output signal having an L (low) level to the buffer circuit 22. The reference voltage $V_{RH}$ is higher than the reference voltage $V_{RL}$.

Figure 7:
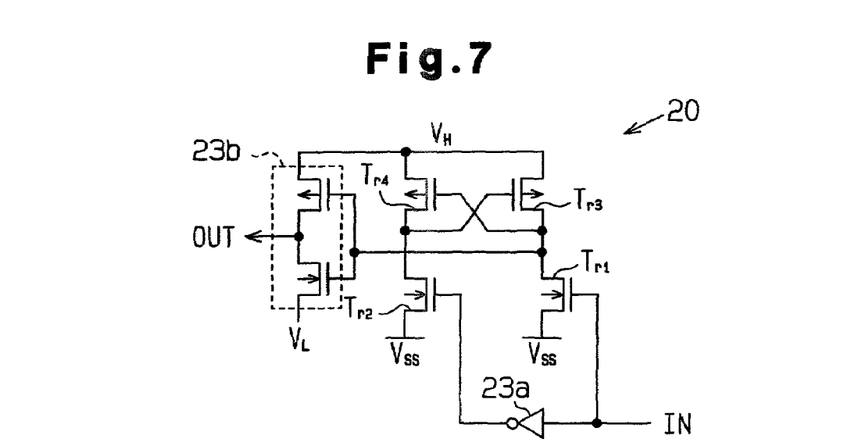
FIG. 7 is a schematic circuit diagram of a driver of the input/output circuit of FIG. 6.

FIG. 7 presents a schematic circuit diagram of the driver 20. The input signal IN is supplied to the gate of an N channel MOS (NMOS) transistor Tr1 and also to the gate of an NMOS transistor Tr2 via an inverter circuit 23a.

The voltage of the voltage supply $V_{SS}$ is supplied to the source of the transistor Tr1 whose drain is connected to the drain of a P channel MOS (PMOS) transistor Tr3. The voltage of the voltage supply $V_{SS}$ is supplied to the source of the transistor Tr2 whose drain is connected to the drain of a PMOS transistor Tr4.

The output-level generation voltage $V_H$ is supplied to the sources of the transistors Tr3 and Tr4, the gate of the transistor Tr3 is connected to the drain of the transistor Tr4 whose gate is connected to the drain of the transistor Tr3. The drain of the transistor Tr3 is connected to the input terminal of an inverter circuit 23b as an output stage.

The inverter circuit 23b is supplied with the output-level generation voltage $V_H$ as a high-potential supply voltage and with the output-level generation voltage $V_L$ as a low-potential supply voltage.

The inverter circuit 23b outputs the output signal OUT which is in phase with the input signal of the driver 20. The output signal OUT varies between the output-level generation voltages $V_H$ and $V_L$.

Figure 8:
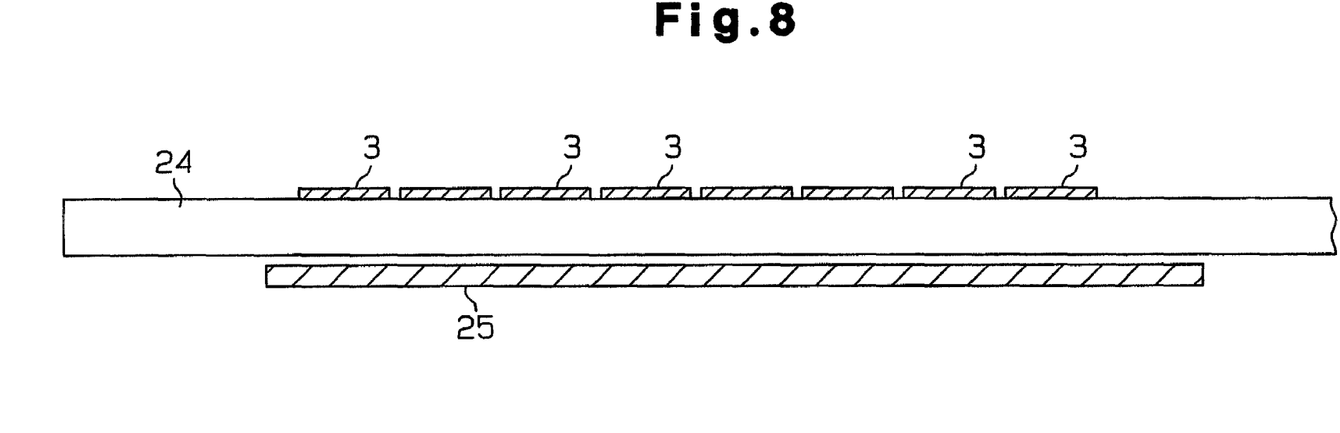
FIG. 8 is a cross-sectional view showing the connection between the BOST chip of the test apparatus of FIG. 1 and a wafer.

As shown in FIG. 8, the BOSTs 3 are connected to the memory chip 2 formed on a wafer 25 via a contactor substrate 24. Each BOST 3 is connected to the associated in memory chip 2.

Figure 9:
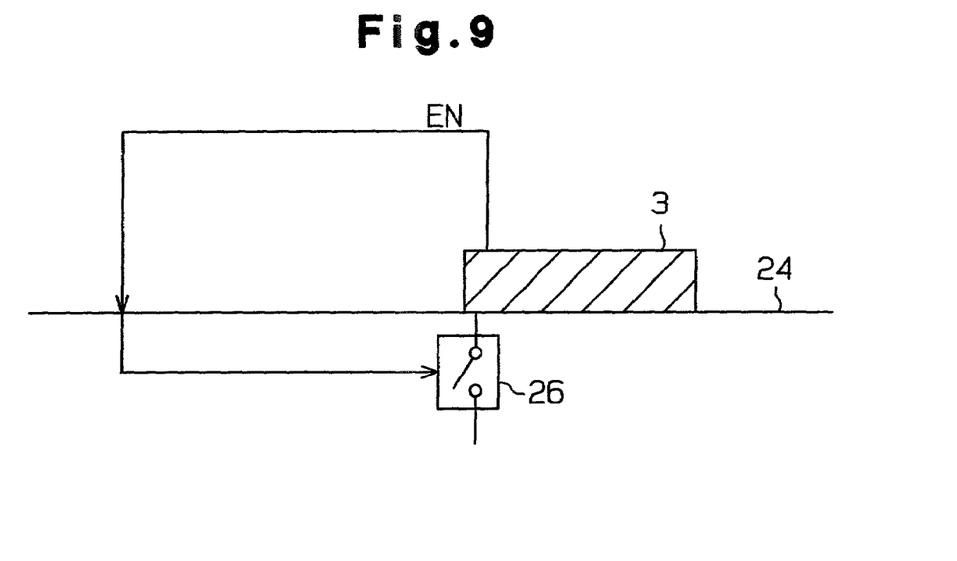
FIG. 9 is an explanatory diagram showing the connection between the BOST chip of the test apparatus of FIG. 1 and the wafer.

As shown in FIG. 9, the BOST 3 is connected to the memory chip 2 via a switch circuit 26 which is connected to an intra-substrate interconnection line of the contactor substrate 24. The switch circuit 26 is opened or closed in response to an enable signal EN output from the BOST 3.

The BOST 3 generates the enable signal EN based on a decision signal read from the result holding RAM 15 of the decision circuit 6. When the memory chip 2 is determined as defective based on the decision signal, the enable signal EN disables the switch circuit 26. When the memory chip 2 is determined as normal, the enable signal EN enables the switch circuit 26. The memory chip 2 that has been decided as defective in the operational test, it is disconnected from the BOST 3 and the supply of the BOST-OUT signals to the memory chip 2 is stopped.

Figure 10:
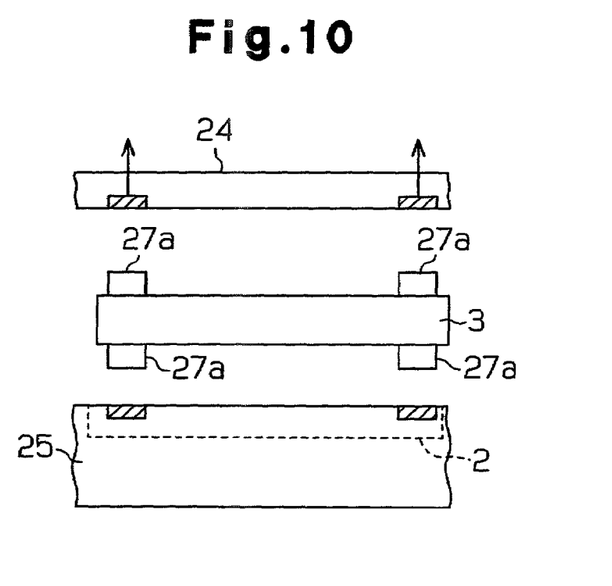
FIG. 10 is a schematic side view illustrating one connection between the BOST chip of the test apparatus of FIG. 1 and the wafer.
Figure 11:
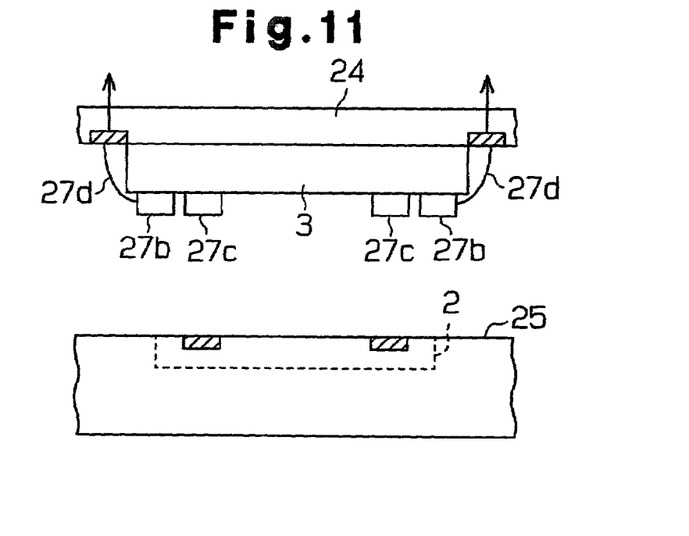
FIG. 11 is a schematic side view illustrating another connection between the BOST chip of the test apparatus of FIG. 1 and the wafer.
Figure 12:
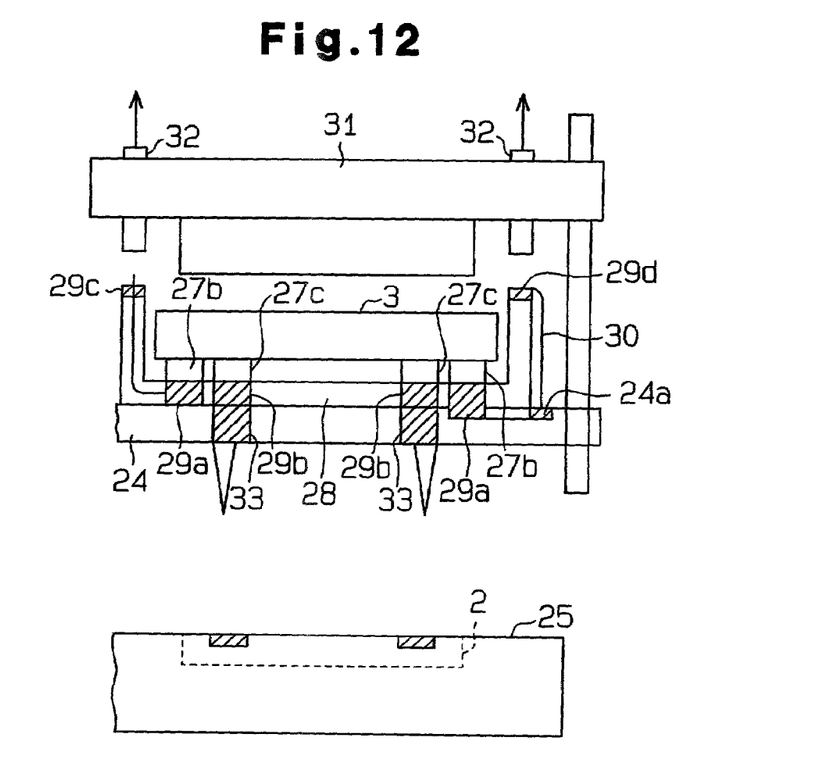
FIG. 12 is a schematic side view illustrating a different connection between the BOST chip of the test apparatus of FIG. 1 and the wafer.

FIGS. 10 through 12 illustrate different connections between the BOST 3 and the memory chip 2 on the wafer 25.

According to the connection method shown in FIG. 10, contactors 27a are formed on both the top and bottom surfaces of the BOST chip 3. In this case, the BOST chip 3 is sandwiched between the contactor substrate 24 and the wafer 25, the external test unit 1 is connected to the memory chip 2 on the wafer 25 via the BOST chip 3 which is connected in close proximity to the memory chip 2.

The BOST-IN signals are supplied to the BOST 3 from the external test unit 1 via the contactor substrate 24, and the BOST-OUT signals generated in the BOST 3 are supplied to the memory chip 2 on the wafer 25 via the contactors 27a.

According to the connection method, a package for retaining the BOST chip 3 may be formed and contactors may be formed on both the top and bottom surfaces of the package. In this case, it is possible to retain different BOST chips 3 in a general-purpose package and connect the contactor substrate 24 to the wafer 25 by the BOST 3.

According to the connection method shown in FIG. 11, contactors 27b and 27c are formed only on a first surface of the BOST chip 3, and a second surface of the BOST chip 3 is adhered to the contactor substrate 24. As the contactors 27c of the BOST chip 3 are made to contact the memory chip 2, the external test unit 1 and the memory chip 2 on the wafer 25 are connected via the BOST chip 3. At this time, the BOST chip 3 is connected in close proximity to the memory chip 2.

According to the connection method shown in FIG. 12, the contactors 27b and 27c are formed on the first surface of the BOST chip 3. The BOST chip 3 is retained in a socket 28 and the contactors 27b and 27c are respectively connected to contactors 29a and 29b of the socket 28.

Contactors 29c and 29d are formed on the upper end of the outer wall of the socket 28. Some contactors 29a of the socket 28 are connected to the contactors 29c through the inside of the outer wall of the socket 28. The other contactors 29a are connected to the contactors 29d via contactors 24a formed in the contactor substrate 24 and interconnection lines 30 laid in the outer wall.

The socket 28 is fastened into a cap 31 which is provided with pogo pins 32. The pogo pins 32 are respectively connected to the contactors 29c and 29d. The pogo pins 32 are also connected to the external test unit 1.

The contactors 29b of the socket 28 are connected to contactors 33 formed in the contactor substrate 24. Each contactor 33 has a needle-like portion which runs through the contactor substrate 24. The distal ends of the contactors 33 are connected to the memory chip 2 on the wafer 25.

In the connection method, as the contactors 27b and 27c of the BOST chip 3 are made to contact the contactors 29a and 29b of the socket 28, the external test unit 1 is connected to the memory chip 2 on the wafer 25 via the BOST chip 3. At this time, the BOST chip 3 is connected in close proximity to the memory chip 2.

Figure 13:
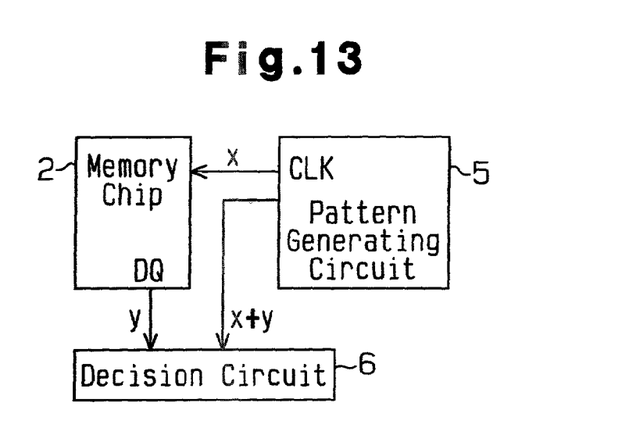
FIG. 13 is a schematic block diagram for explaining an access test.

FIG. 13 shows a method of measuring the access time of the memory chip 2 using the BOST 3 at the time of performing an operational test on the memory chip 2. The pattern generating circuit 5 in the BOST 3 provides the clock signal CLK to the memory chip 2 and the decision circuit 6. In accordance with the clock signal CLK, the memory chip 2 operates and provides an output signal DQ (DATA) to the decision circuit 6.

Let x be the length of the interconnection line for supplying the clock signal CLK to the memory chip 2 from the pattern generating circuit 5, y be the length of the interconnection line for supplying the output signal DQ to the decision circuit 6 from the memory chip 2 and x+y be the length of the interconnection line for supplying the clock signal CLK to the decision circuit 6 from the pattern generating circuit 5. The decision circuit 6 compares the input timing for the output signal DQ with the input timing for the clock signal CLK to measure the access time from the supply of the clock signal CLK to the memory chip 2 to the outputting of the output signal DQ. That is, the method can measure the access time without using a correction circuit for correcting delays caused by the interconnection lines x and y.

The structure for determining the access time will now be described. The decision circuit 6 shown in FIG. 14 includes latch circuits 34a and 34b, a selection circuit 35, a frequency counter 36, a high frequency generator 37 and an access time determining circuit 38 in addition to the driver 12, the comparator 13, the P/F decision circuit 14 and the result holding RAM 15 shown in FIG. 3.

Figure 15:
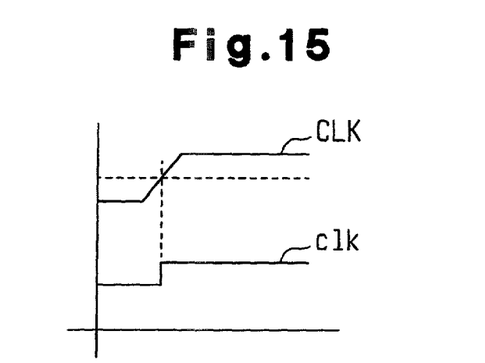
FIG. 15 is a waveform diagram illustrating clock signals which are generated by the decision circuit of FIG. 14.
Figure 16:
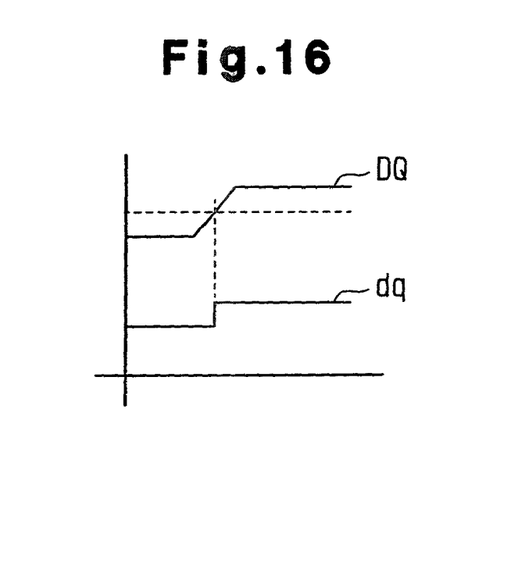
FIG. 16 is a waveform diagram illustrating output signals of a memory chip which are generated by the decision circuit of FIG. 14.

The latch circuit 34a compares the voltage of the clock signal CLK supplied from the pattern generating circuit 5 with a predetermined decision voltage and generates an access clock signal clk of an H level or L level, as shown in FIG. 15. The latch circuit 34b compares the voltage of the output signal DQ supplied from the memory chip 2 with a predetermined decision voltage and generates an access signal dq of an H level or L level, as shown in FIG. 16.

Figure 14:
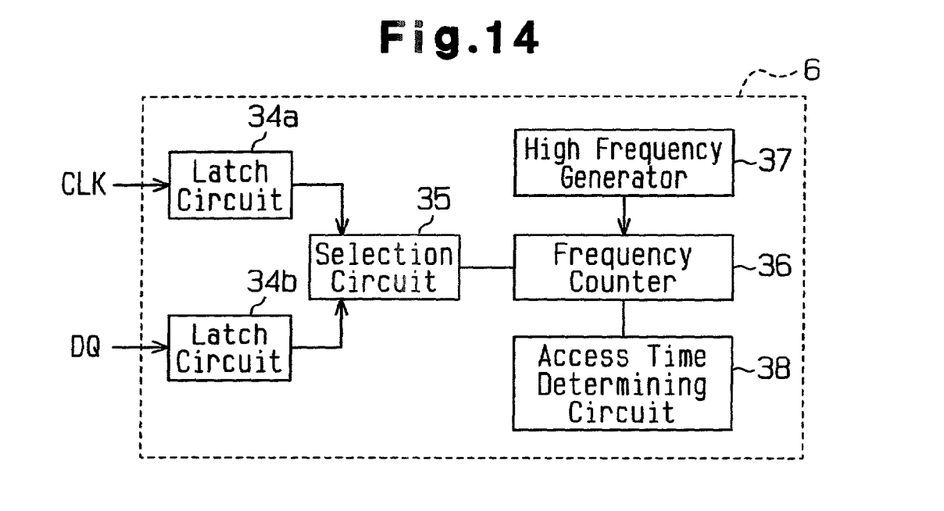
FIG. 14 is a schematic block diagram of a decision circuit of a test circuit of FIG. 1.

The selection circuit 35 receives the access clock signal clk and the access signal dq and generates an output signal which goes to an H level in response to that one of the access clock signal clk and access signal dq which rises earlier and goes to an L level in response to the signal that rises later. That is, the selection circuit 35 generates an EOR logical signal of the access clock signal clk and the access signal dq.

The frequency counter 36 counts the number of pulses of a high-frequency pulse signal from the high frequency generator 37. The frequency counter 36 resets the count value and starts counting the number of pulses of the output signal of the high frequency generator 37 in response to the rising of the output signal of the selection circuit 35, and stops counting in response to the falling of the output signal of the selection circuit 35.

The access time determining circuit 38 compares the count value of the frequency counter 36 with a predetermined reference value and outputs a comparison result. Based on the comparison result, it is determined whether the access time lies within a predetermined range.

Figure 17:
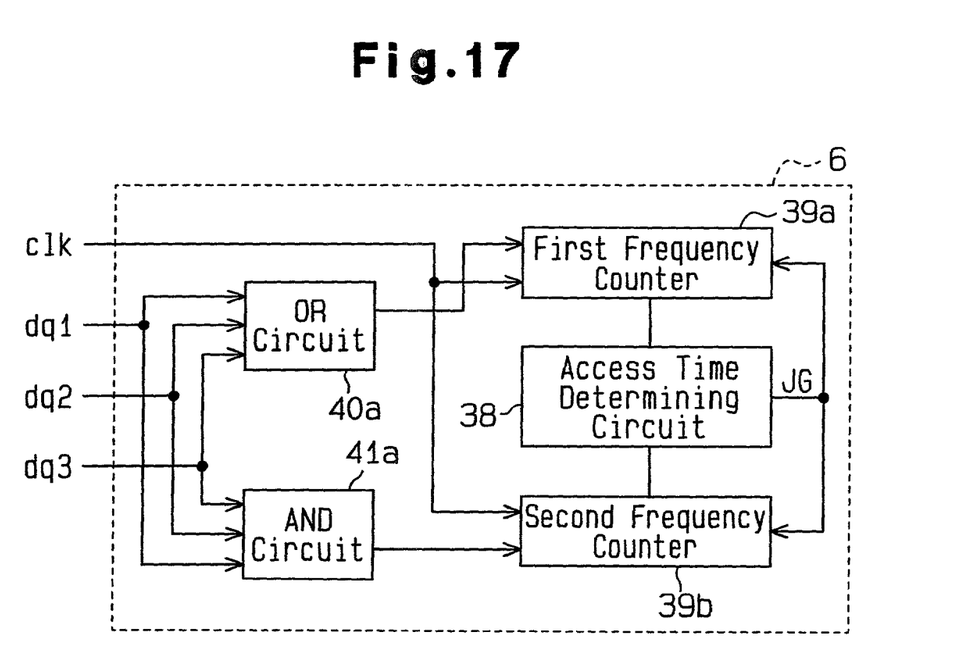
FIG. 17 is a schematic block diagram of another decision circuit of the test circuit of FIG. 1.

Referring now to FIG. 17, a description will be given of the decision circuit 6 which includes the access time determining circuit in case where the output signals DQ of plural bits are output in parallel from the memory chip 2.

The decision circuit 6 includes the access time determining circuit 38, first and second frequency counters 39a and 39b, an OR circuit 40a and an AND circuit 41a.

The clock signal CLK is latched in the latch circuit (not shown) and the access clock signal clk is generated. The access clock signal clk is supplied to the first and second frequency counters 39a and 39b.

Output signals DQ1 to DQ3 are latched in the respective latch circuits (not shown) and access signals dq1 to dq3 are generated. The access signals dq1 to dq3 are supplied to the OR circuit 40a and the AND circuit 41a. The output signal of the OR circuit 40a is supplied to the first frequency counter 39a, and the output signal of the AND circuit 41a is supplied to the second frequency counter 39b.

A high-frequency pulse signal is supplied to each of the first and second frequency counters 39a and 39b. The first frequency counter 39a starts counting the pulses of the pulse signal at the rising of the output signal of the OR circuit 40a and stops counting at the rising of the access clock signal clk. The second frequency counter 39b starts counting the pulses of the pulse signal at the rising of the access clock signal clk and stops counting at the falling of the output signal of the AND circuit 41a.

The count values of the first and second frequency counters 39a and 39b are supplied to the access time determining circuit 38 which in turn determines the access time based on the count values.

Figure 18:
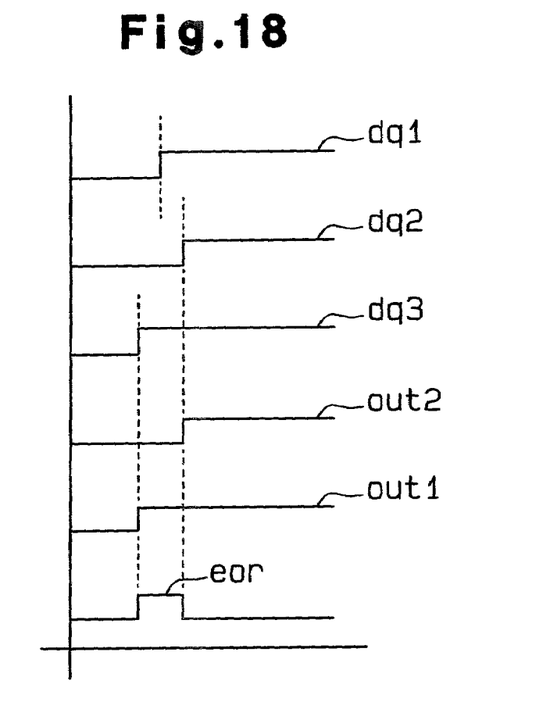
FIG. 18 is a waveform diagram illustrating the operation of the decision circuit of FIG. 17.

When the rising times of the access signals dq1 to dq3 differ from one another, as shown in FIG. 18, an output signal out1 is output from the OR circuit 40a and an output signal out2 is output from the AND circuit 41a.

A signal eor rises in response to the rising of the output signal out1 and falls in response to the falling of the output signal out2. That is, the signal eor indicates the EOR logic of the output signals out1 and out2 and represents the skew of the access signals dq1 to dq3.

Figure 19:
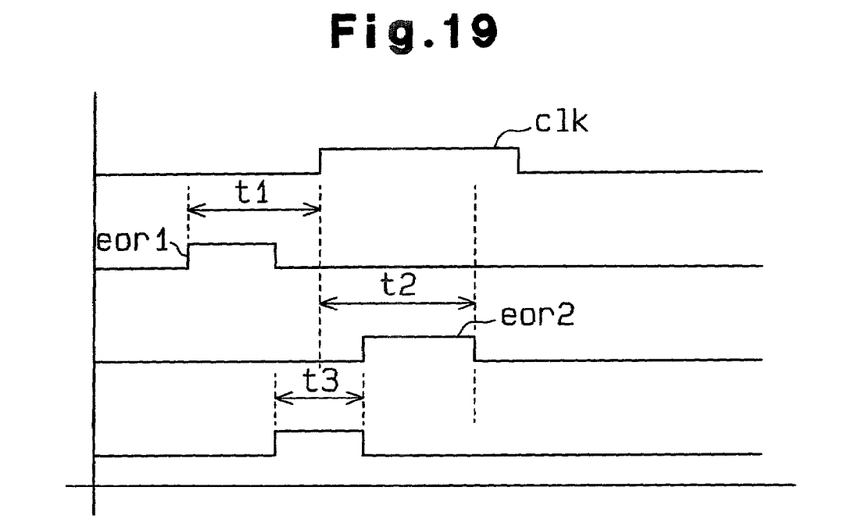
FIG. 19 is a waveform diagram illustrating the operation of the decision circuit of FIG. 17.

The operation of the access time determining circuit 38 will now be described by referring to FIG. 19. To begin with, a description will be given of the case where the rising of the access signals dq1 to dq3 leads the rising of the access clock signal clk (the case of a signal eor1).

In this case, a time t1 from the rising of the signal eor1 to the rising of the access clock signal clk is the access time that should be guaranteed. At the rising of the signal eor1, the first frequency counter 39a is reset and starts the counting operation. The first frequency counter 39a performs the counting operation during the time t1 from the rising of the signal eor1 to the falling of the access clock signal clk. Therefore, the count value of the first frequency counter 39a during the time t1 is supplied to the access time determining circuit 38. The access time determining circuit 38 determines the access time based on the count value and generates a decision signal JG.

A description will now be given of the case where the rising of the access signals dq1 to dq3 lags behind the rising of the access clock signal clk (the case of a signal eor2).

In this case, a time t2 from the rising of the access clock signal clk to the falling of the signal eor2 is the access time that should be guaranteed. At the rising of the access clock signal clk, the second frequency counter 39b is reset and starts the counting operation. The second frequency counter 39b performs the counting operation during the time t2 from the rising of the access clock signal clk to the falling of the signal eor2. Therefore, the count value of the second frequency counter 39b during the time t2 is supplied to the access time determining circuit 38. The access time determining circuit 38 determines the access time based on the count value and generates the decision signal JG.

A description will now be given of the case where the access signals dq1 to dq3 rise around the rising of the access clock signal clk (the case of a signal eor3). In this case, a time t3 from the rising of the signal eor3 to the falling thereof is the access time that should be guaranteed. During the time from the rising of the signal eor3 to the rising of the access clock signal clk, the first frequency counter 39a performs the counting operation. During the time from the rising of the access clock signal clk to the falling of the signal eor3, the second frequency counter 39b performs the counting operation. The count values of the first and second frequency counters 39a and 39b are supplied to the access time determining circuit 38. The access time determining circuit 38 determines the access time based on the two count values and generates the decision signal JG.

There may be a case where a signal for stopping the counting operation is not supplied to one of the first and second frequency counters 39a and 39b in the decision circuit. In this case, the counting operation may be stopped in the following manner. One frequency counter receives the decision signal JG based on the count value of the other frequency counter from the access time determining circuit 38 and stops the counting operation.

Figure 20:
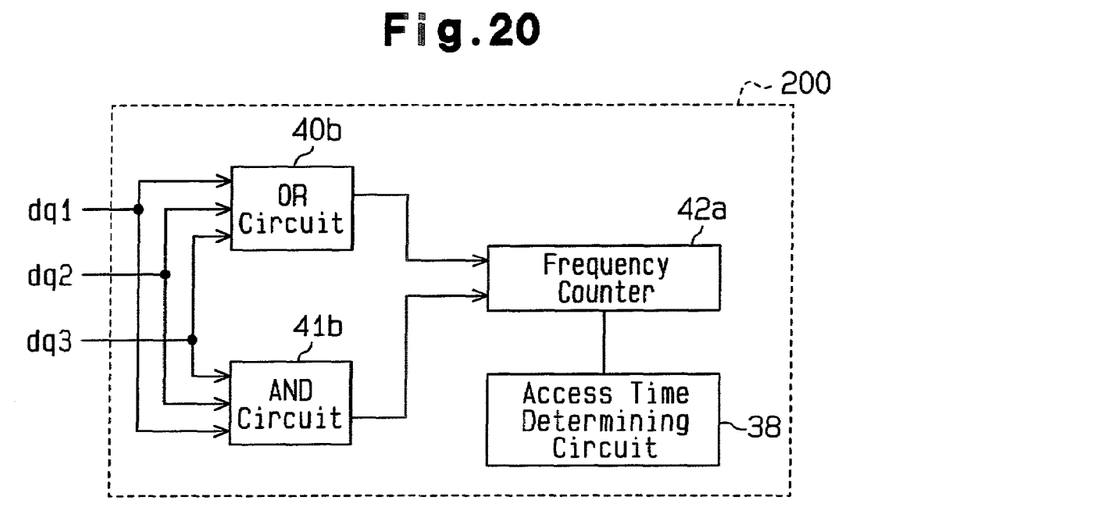
FIG. 20 is a schematic block diagram of a further decision circuit of the test circuit of FIG. 1.

FIG. 20 illustrates a circuit 200 which determines the skew of the access signals dq1 to dq3. The decision circuit 200 includes an OR circuit 40b, an AND circuit 41b, a frequency counter 42a and the access time determining circuit 38.

The OR circuit 40b receives the access signals dq1 to dq3 and supplies an OR logical signal to the frequency counter 42a. The AND circuit 41b receives the access signals dq1 to dq3 and supplies an AND logical signal to the frequency counter 42a. The frequency counter 42a performs the counting operation in accordance with the OR logical signal from the OR circuit 40b and the AND logical signal from the AND circuit 41b and provides a count value to the access time determining circuit 38. The access time determining circuit 38 determines the skew of the access signals dq1 to dq3 based on the count value.

Figure 21:
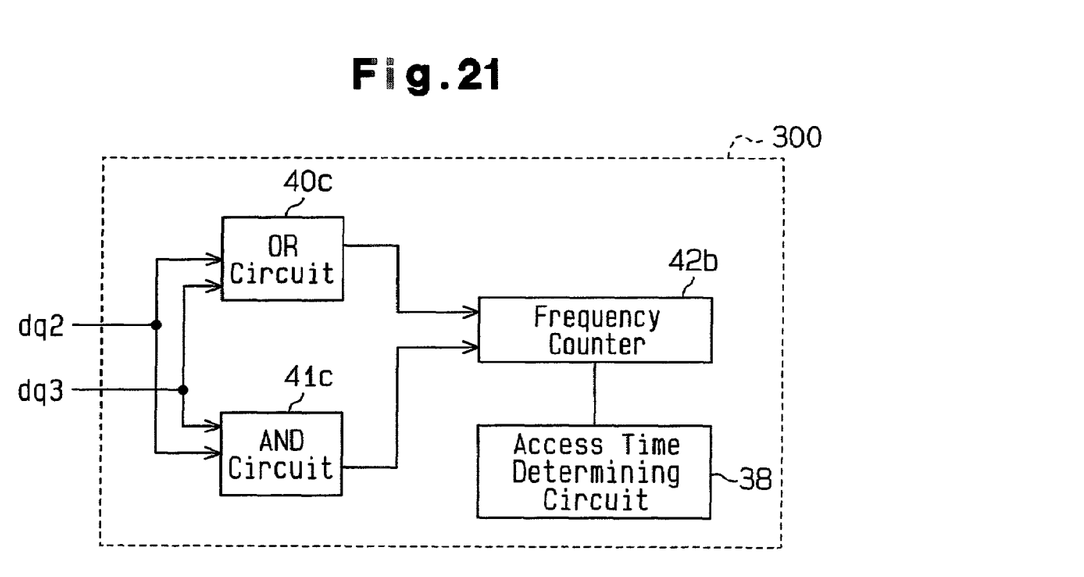
FIG. 21 is a schematic block diagram of a different decision circuit of the test circuit of FIG. 1.

FIG. 21 is a schematic block diagram showing a decision circuit 300 which determines the access time using a reference clock signal ck and an access signal dq supplied from the external test unit 1. An OR circuit 40c receives the reference clock signal ck and the access signal dq and generates an OR logical signal. An AND circuit 41c receives the reference clock signal ck and the access signal dq and generates an AND logical signal. A frequency counter 42b performs the counting operation in accordance with the OR logical signal and the AND logical signal and provides a count value to the access time determining circuit 38. The access time determining circuit 38 determines the access time based on the count value.

The test apparatus 100 has the following advantages.

(1) The pattern dependency test and timing dependency test for the memory chip 2 can be conducted using the external test unit 1, the BOST 3 or a test chip and the BIST 4 in the memory chip 2.

(2) The pattern dependency test can be performed by operating the BIST 4 in response to the control signal supplied to the BIST 4 via the BOST 3 from the external test unit 1.

(3) The wave formatter 9 produces back pattern data from front pattern data of test pattern data PT in accordance with the expected-value control signal supplied from the external test unit 1 using the test pattern data PT read from the pattern memory 7 of the pattern generating circuit 5 of the BOST 3. It is therefore unnecessary to store both front pattern data and back pattern data in the pattern memory 7 with respect to a single piece of test pattern data PT. This can lead to reduction of the memory capacity of the pattern memory 7 and make the BOST chip 3 compact.

(4) The BOST 3 generates test pattern data PT for the timing dependency test and supplies the test pattern data PT to the memory chip 2 on the wafer 25. The BOST 3 is located in close proximity to the wafer 25. As the test pattern data PT is supplied from a location near the wafer 25, therefore, the precision of the waveform of the test pattern data PT is improved. This results in a faster operational test and an improvement of the reliability of the operational test.

Figure 3:
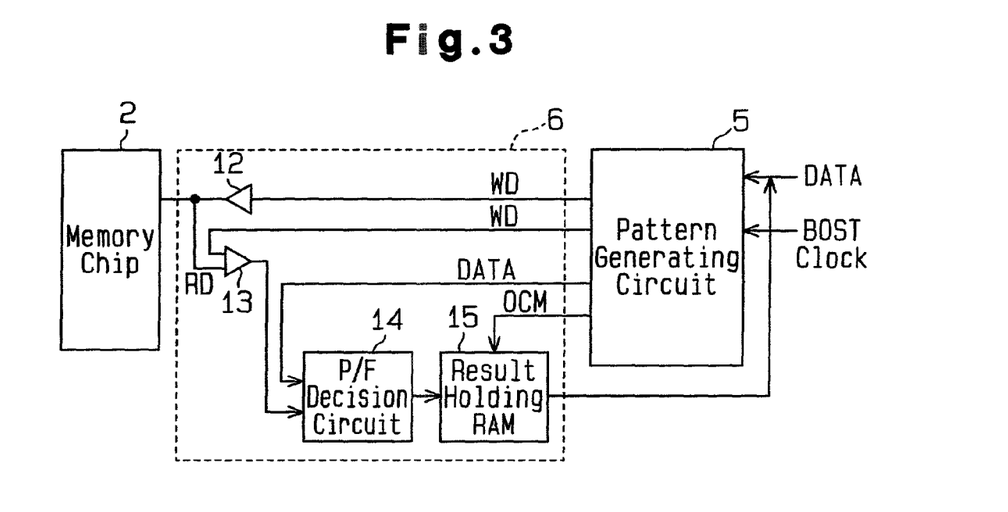
FIG. 3 is a schematic block diagram of a decision circuit of the test apparatus of FIG. 1.

(5) As shown in FIG. 3, the decision circuit 6 of the BOST 3 determines if data read from the memory chip 2 is normal. When the data is normal, the decision circuit 6 directly supplies the expected-value control signal DATA, supplied from the external test unit 1, to the external test unit 1 as the decision result. If the data is not normal, the decision circuit 6 inverts the expected-value control signal DATA and supplies the inverted expected-value control signal DATA to the external test unit 1 as the decision result. Therefore, the external test unit 1 can easily perform a defect check based on the result of the operational test.

Figure 6:
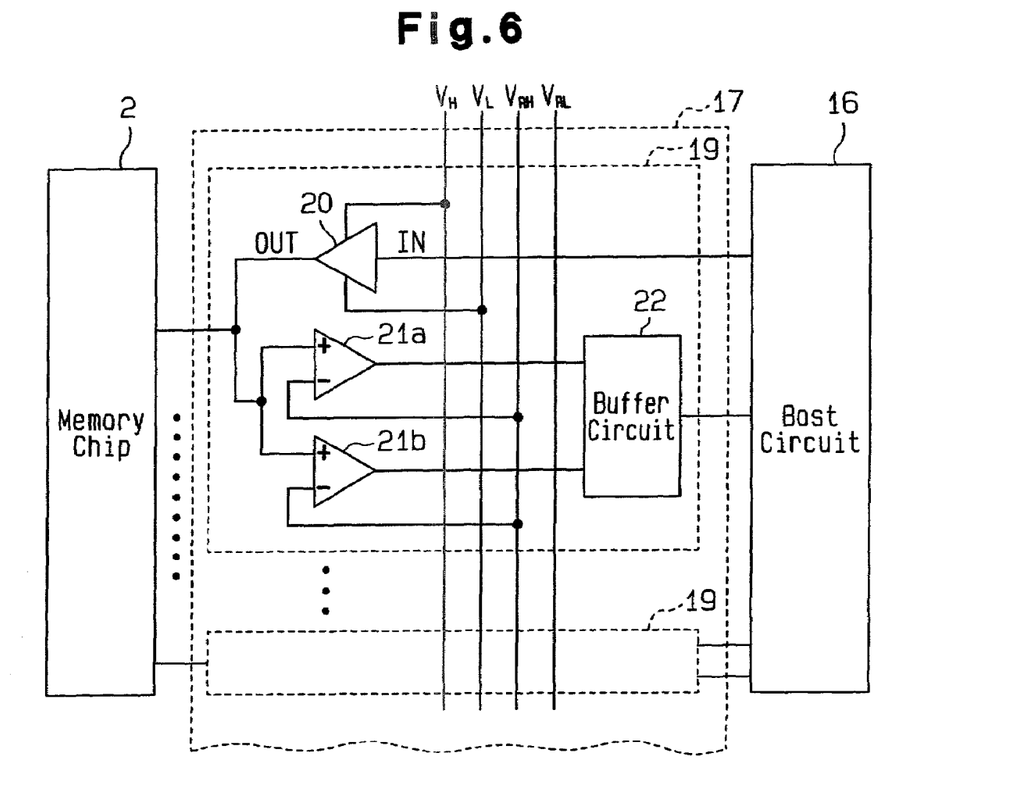
FIG. 6 is a schematic circuit diagram of an input/output circuit of the BOST of FIG. 5.

(6) As shown in FIG. 6, the external test unit 1 supplies the output-level generation voltages $V_H$ and $V_L$ to the driver 20 of the I/O circuit 17 in the BOST 3. This stabilizes the level of the output signal of the BOST 3 that is to be supplied to the memory chip 2, thus improving the reliability of the operational test.

(7) As shown in FIG. 6, the external test unit 1 supplies the input-level reference voltages $V_{RH}$ and $V_{RL}$ to the comparators 21a and 21b of the I/O circuit 17 in the BOST 3. This stabilizes the operation of determining the level of the output signal of the memory chip 2, thus improving the reliability of the operational test.

(8) As shown in FIG. 9, the memory chip 2 that has been determined as defective is disconnected from the BOST 3. Therefore, a defective memory chip can be disabled reliably, thus preventing other normal memory chips from malfunctioning due to the operation of the defective memory chip.

(9) According to the connection methods illustrated in FIGS. 10 to 12, the BOST chip 3 is placed at a position in close proximity to the memory chip 2 on the wafer 25. This results in a faster operational test and an improvement of the reliability of the operational test.

(10) As the BOST chip 3 is retained in the socket 28, it is easy to replace a damaged BOST chip 3 with a proper one.

(11) The access-time measuring method shown in FIG. 13 can measure the access time free of the delay caused by the length of the interconnection line between the pattern generating circuit 5 and the memory chip 2 and the length of the interconnection line between the memory chip 2 and the decision circuit 6, without using a correction circuit.

(12) The access time of the output signal DQ of the memory a chip 2 is measured by generating an EOR logical signal of the clock signal CLK and the output signal DQ and counting the pulse width of that EOR logical signal by means of the frequency counter.

(13) In case where a multi-bit output signal is read from the memory chip 2, as shown in FIG. 17, the output signal of each bit is supplied to the OR circuit 40a and the AND circuit 41a. In response to the logical output signals of the OR circuit 40a and the AND circuit 41a, the first and second frequency counters perform the counting operations. The access time determining circuit 38 measures the access time of the output signal based on the count values.

(14) As shown in FIG. 20, the skew of a multi-bit output signal can be measured and determined.

It should be apparent to those skilled in the art that the present invention may be embodied in many other specific forms without departing from the spirit or scope of the invention. Particularly, it should be understood that the invention may be embodied in the following forms.

In FIG. 10, the BOST chip 3 may be retained in a package which has contactors formed on both sides.

The operational test may be performed on other semiconductor IC chips than a memory chip.

Therefore, the present examples and embodiments are to be considered as illustrative and not restrictive and the invention is not to be limited to the details given herein, but may be modified within the scope and equivalence of the appended claims.

What is claimed is:

1. A test apparatus for testing a semiconductor device, comprising:
   an external test unit;
   a built in self test (BIST) circuit formed in the semiconductor device; and
   a built out self test (BOST) device which is coupled between the external test unit and the semiconductor device, wherein first pattern data for a pattern dependency test is previously stored in the BIST circuit and second pattern data for a timing dependency test is previously stored in the BOST device, wherein the BOST device includes
   a pattern generating circuit, coupled to the semiconductor device, for providing the previously stored second pattern data for the timing dependency test to the semiconductor device, and
   a decision circuit, coupled to the pattern generating circuit and the semiconductor device, for receiving test data originating from the second pattern data from the semiconductor device and determining the test result of the timing dependency test using the test data and the second pattern data,
   wherein the pattern generating circuit includes
   a pattern memory for storing the second pattern data for the timing dependency test,
   a timing generator, coupled to the pattern memory, for generating a reference clock signal and receiving the second pattern data for the timing dependency test from the pattern memory, and
   a wave formatter, coupled to the timing generator, for receiving the second pattern data for the timing dependency test from the timing generator in accordance with the reference clock signal and providing the second pattern data for the timing dependency test to the semiconductor device as front pattern data, wherein the wave formatter generates back pattern data by inverting the front pattern data in accordance with a control signal,
   wherein the decision circuit includes a measuring circuit for measuring an access time of the semiconductor device using an output signal from the semiconductor device and the clock signal output from the pattern generating circuit, and
   wherein the measuring circuit includes:
   a logic circuit for generating an EOR logical signal by performing an EOR operation on the clock signal and the output signal; and
   a frequency counter, coupled to the logic circuit, for measuring a time interval of the EOR logical signal.

2. The test apparatus according to claim 1, wherein the external test unit provides the BOST device with an output level generating voltage which is used to generate an output level and a reference voltage for input level decision, which is used to determine an input signal supplied from the BOST device.

3. The test apparatus according to claim 1, wherein the BIST circuit generates a signal indicative of a test result by performing a pattern dependency test on the semiconductor device using the first pattern data for the pattern dependency test, and the decision circuit receives the signal indicative of the test result from the BIST circuit and determines whether the pattern dependency test result is accurate.

4. The test apparatus according to claim 1, wherein based on a determination result on the test result of the timing dependency test, the decision circuit provides reference data to the external test unit or generates inverted data of the reference data and provides the inverted data to the external test unit.

5. The test apparatus according to claim 1, wherein the semiconductor device is one of a plurality of semiconductor devices arranged on a wafer, and the test apparatus further comprises:
   a contactor substrate for coupling the BOST device to the semiconductor device; and
   a switch circuit, provided in the contactor substrate, for disconnecting the BOST device from the semiconductor device in accordance with a determination result from the decision circuit.

6. The test apparatus according to claim 1, wherein the semiconductor device is one of a plurality of semiconductor devices arranged on a wafer, the BOST device has a first surface having a first contactor, which is coupled to the semiconductor device, and a second surface having a second contactor, and the test apparatus further comprises a contactor substrate coupled to the second contactor.

7. The test apparatus according to claim 1, wherein the semiconductor device is one of a plurality of semiconductor devices arranged on a wafer, and the test apparatus further comprises:
   a socket for retaining the BOST device; and
   a contactor substrate, applied to the socket, for connecting the BOST device to the semiconductor device.

8. The test apparatus according to claim 1, wherein the pattern generating circuit generates a the clock signal, and the test apparatus further comprises:
   a first interconnection line for supplying the clock signal to the semiconductor device from the pattern generating circuit;
   a second interconnection line for connecting the semiconductor device to the decision circuit; and
   a third interconnection line which has a length equal to a sum of lengths of the first and second interconnection lines and provides the clock signal to the decision circuit from the pattern generating circuit.

9. A test apparatus for testing a semiconductor, comprising:
   an external test unit;
   a built in self test (BIST) circuit formed in the semiconductor device; and
   a built out self test (BOST) device which is coupled between the external test unit and the semiconductor device, wherein first pattern data for a pattern dependency test is previously stored in the BIST circuit and second pattern data for a timing dependency test is previously stored in the BOST device, wherein the BOST device includes a pattern generating circuit, coupled to the semiconductor device, for providing the previously stored second pattern data for the timing dependency test to the semiconductor device, and a decision circuit, coupled to the pattern generating circuit and the semiconductor device, for receiving test data originating from the second pattern data from the semiconductor device and determining the test result of the timing dependency test using the test data and the second pattern data, wherein the pattern generating circuit includes a pattern memory for storing the second pattern data for the timing dependency test, a timing generator, coupled to the pattern memory, for generating a reference clock signal and receiving the second pattern data for the timing dependency test from the pattern memory, and a wave formatter, coupled to the timing generator, for receiving the second pattern data for the timing dependency test from the timing generator in accordance with the reference clock signal and providing the second pattern data for the timing dependency test to the semiconductor device as front pattern data, wherein the wave formatter generates back pattern data by inverting the front pattern data in accordance with a control signal, wherein the decision circuit includes a measuring circuit for measuring an access time of the semiconductor device using an output signal from the semiconductor device and a clock signal output from the pattern generating circuit, wherein the measuring circuit includes:

an OR circuit for receiving an output signal of plural bits output from the semiconductor device and generating an OR logical signal;

an AND circuit for receiving an output signal of plural bits output from the semiconductor device and generating an AND logical signal;

a first frequency counter, coupled to the OR circuit, for generating a first count value in accordance with the OR logical signal and the clock signal;

a second frequency counter, coupled to the AND circuit, for generating a second count value in accordance with the AND logical signal and the clock signal; and an access-time measuring circuit, coupled to the first and second frequency counters, for measuring an access time of the semiconductor device based on one of the first and second count values.

* * * * *